(12) United States Patent
Lee

(10) Patent No.: US 8,339,189 B2
(45) Date of Patent: Dec. 25, 2012

(54) HIGH VOLTAGE CURRENT SOURCE AND VOLTAGE EXPANDER IN LOW VOLTAGE PROCESS

(75) Inventor: Edward K. F. Lee, Fullerton, CA (US)

(73) Assignee: Alfred E. Mann Foundation For Scientific Research, Santa Clarita, CA (US)

( * ) Notice: Subject to any disclaimer, the term of this patent is extended or adjusted under 35 U.S.C. 154(b) by 172 days.

(21) Appl. No.: 12/869,442

(22) Filed: Aug. 26, 2010

(65) Prior Publication Data

US 2011/0050331 A1 Mar. 3, 2011

Related U.S. Application Data

(60) Provisional application No. 61/237,239, filed on Aug. 26, 2009.

(51) Int. Cl.
*G05F 1/10* (2006.01)
(52) U.S. Cl. .................. 327/538; 327/540; 327/541
(58) Field of Classification Search ........... 327/538–541
See application file for complete search history.

(56) References Cited

U.S. PATENT DOCUMENTS

| | | | | |
|---|---|---|---|---|
| 4,193,040 | A | * | 3/1980 | Weissman ............ 330/293 |
| 4,317,055 | A | | 2/1982 | Yoshida |
| 4,751,408 | A | * | 6/1988 | Rambert ............ 327/436 |
| 4,900,955 | A | | 2/1990 | Kurpan |
| 5,382,826 | A | | 1/1995 | Mojaradi |
| 5,504,444 | A | | 4/1996 | Neugebauer |
| 6,380,793 | B1 | * | 4/2002 | Bancal et al. ......... 327/427 |
| 6,518,818 | B1 | | 2/2003 | Hynes |
| 7,619,252 | B2 | * | 11/2009 | Gruber et al. ......... 257/69 |
| 7,649,384 | B2 | | 1/2010 | Ho |

FOREIGN PATENT DOCUMENTS

| | | |
|---|---|---|
| EP | 1087441 A2 | 3/2001 |
| EP | 2293445 A3 | 3/2012 |
| WO | 03/030360 A2 | 4/2003 |
| WO | 03/030360 A3 | 4/2003 |

OTHER PUBLICATIONS

Hess, H. L., et al, Transformerless Capacitive Coupling of Gate Signals for Series Operation of Power MOS Device, IEEE on Power Electronics, vol. 15, No. 5, Sep. 2000.
Mentze, E.J., et al., A Scalable High-Voltage Output Driver for Low-Voltage CMOS Technologies, IEEE Transactions on Very Large Scale Ingegration (VLSI) Systems, vol. 14, No. 12, Dec. 2006.
Extended European Search Report, European Patent Application EP 10174233.6, Feb. 14, 2012.

* cited by examiner

*Primary Examiner* — Kenneth B. Wells
(74) *Attorney, Agent, or Firm* — Oleh J. Zajac

(57) ABSTRACT

A high voltage current source and a voltage expander implemented in a low voltage semiconductor process. The voltage expander extends the operating voltage range of a stack of transistors to multiple times a supply voltage Vdd at the output node of the stack without exceeding the breakdown voltage of any of the transistors in the stack. The voltage expander uses a diode and a voltage divider to detect the output node voltage changes and generates a plurality of voltages that control the gate voltages for the stack of transistors. A high voltage wide swing current source utilizes a transistor to set the output current and the voltage expander to extend the output voltage range of the current setting transistor. An additional transistor and another current source ensure that the output current is constant throughout the entire output voltage range between about 0V and multiple times the supply voltage Vdd.

9 Claims, 3 Drawing Sheets

HIGH VOLTAGE CURRENT SOURCE AND VOLTAGE EXPANDER IN LOW VOLTAGE PROCESS

CROSS REFERENCE TO RELATED APPLICATIONS

This application claims the benefit under 35 USC 119(e) of provisional patent application No. 61/237,239, which was filed on Aug. 26, 2009, and which is hereby incorporated by reference.

FIELD OF THE INVENTION

The invention relates to semiconductor circuits, and more specifically to a voltage expander and a high voltage current source implemented in a low voltage semiconductor process.

BACKGROUND OF THE INVENTION

Advanced integrated circuit fabrication processes such as CMOS can produce chips with low power consumption, high logic density and high speed of operation. However, these modern processes manufacture integrated circuits that operate at low voltages, due to the lowered breakdown voltages of the transistors that are fabricated. These low voltage IC's are difficult to interface with circuits operating at higher voltage levels, unless special processes are used that can produce low voltage and high voltage devices in the same IC, but these special processes can have disadvantages such as limited performance capabilities.

One particular area of technology using low voltage ICs but required to interface to higher voltage circuits is implantable medical devices for the purpose of functional electrical stimulation (FES). Such devises stimulate nerve bundles with electrodes in close proximity to the nerve tissue. The ability to process high voltage signals using high voltage tolerant circuits such as voltage expanders and current sources, with integrated circuits built using low voltage advanced CMOS processes, is highly desirable.

SUMMARY OF THE INVENTION

A high voltage current source and a voltage expander implemented in a low voltage semiconductor process are disclosed. The voltage expander extends the operating voltage range of a stack of transistors to k times the supply voltage Vdd at the output node of the stack without exceeding the breakdown voltage of any of the transistors in the stack. The voltage expander uses a diode and a voltage divider to detect the output node voltage changes and generates a plurality of voltages that control the gate voltages for the stack of transistors. A high voltage wide swing current source utilizes a transistor to set the output current and the voltage expander to extend the output voltage range of the current setting transistor. An additional transistor and another current source ensure that the output current is constant throughout the entire output voltage range between about 0V and k×Vdd.

DETAILED DESCRIPTION

Figure 1:
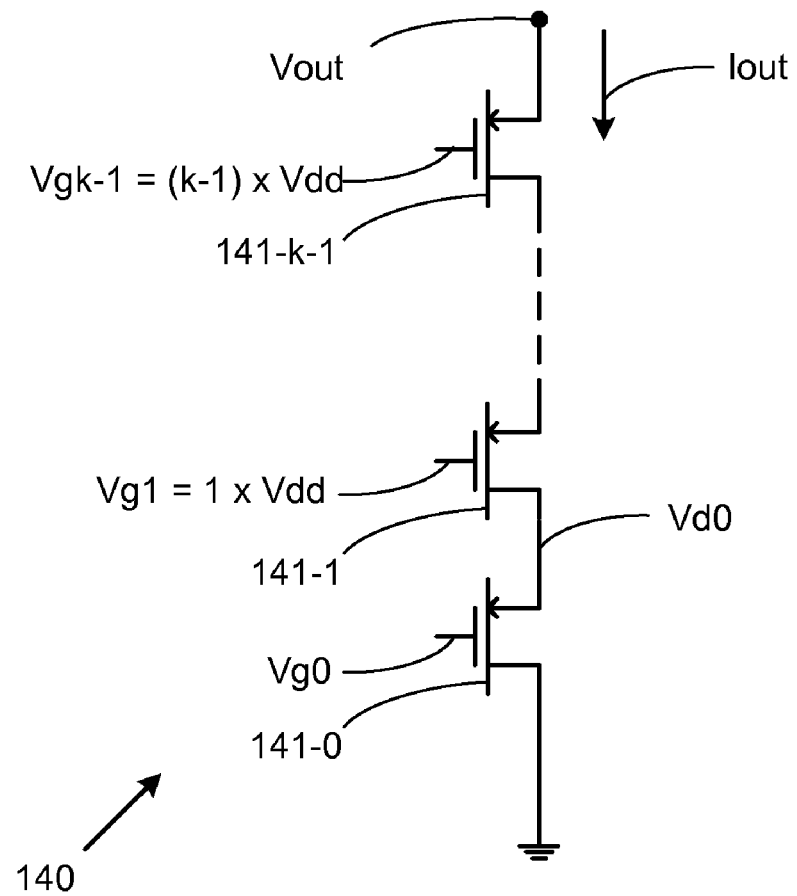
FIG. 1 shows a circuit diagram of a prior art high voltage current source.

FIG. 1 shows a circuit diagram of prior art high voltage current source 140. In order to design high voltage (HV) circuits in a low voltage CMOS process, a common way is to connect a number k of transistors 141-0 to 141-(k−1) in series as shown in FIG. 1. Transistor 141-0 sets the output current for current source 140 and transistors 141-1 to 141-(k−1) are a stack of (k−1) transistors. The gate voltage Vg0 applied to transistor 141-0 determines the output current of current source 140. In this case, a simple high voltage current sink is realized. The gate voltages of the stacked transistors 141-1 to 141-(k−1), Vg1, . . . , Vgk−1 are fixed accordingly such that all Vds's are less than 1×Vdd and approximately equal to (Vout−Vdo)/k, where k is the number of transistors in series and Vdo is the drain voltage of transistor 141-0. However, the voltage at the output Vout can only swing within 1×Vdd and cannot reach close to ground without exceeding the voltage breakdown limits of individual transistors in the stack. Nevertheless, a simple high voltage current source, but with very limited capabilities can be designed using a different polarity of transistors.

Figure 2:
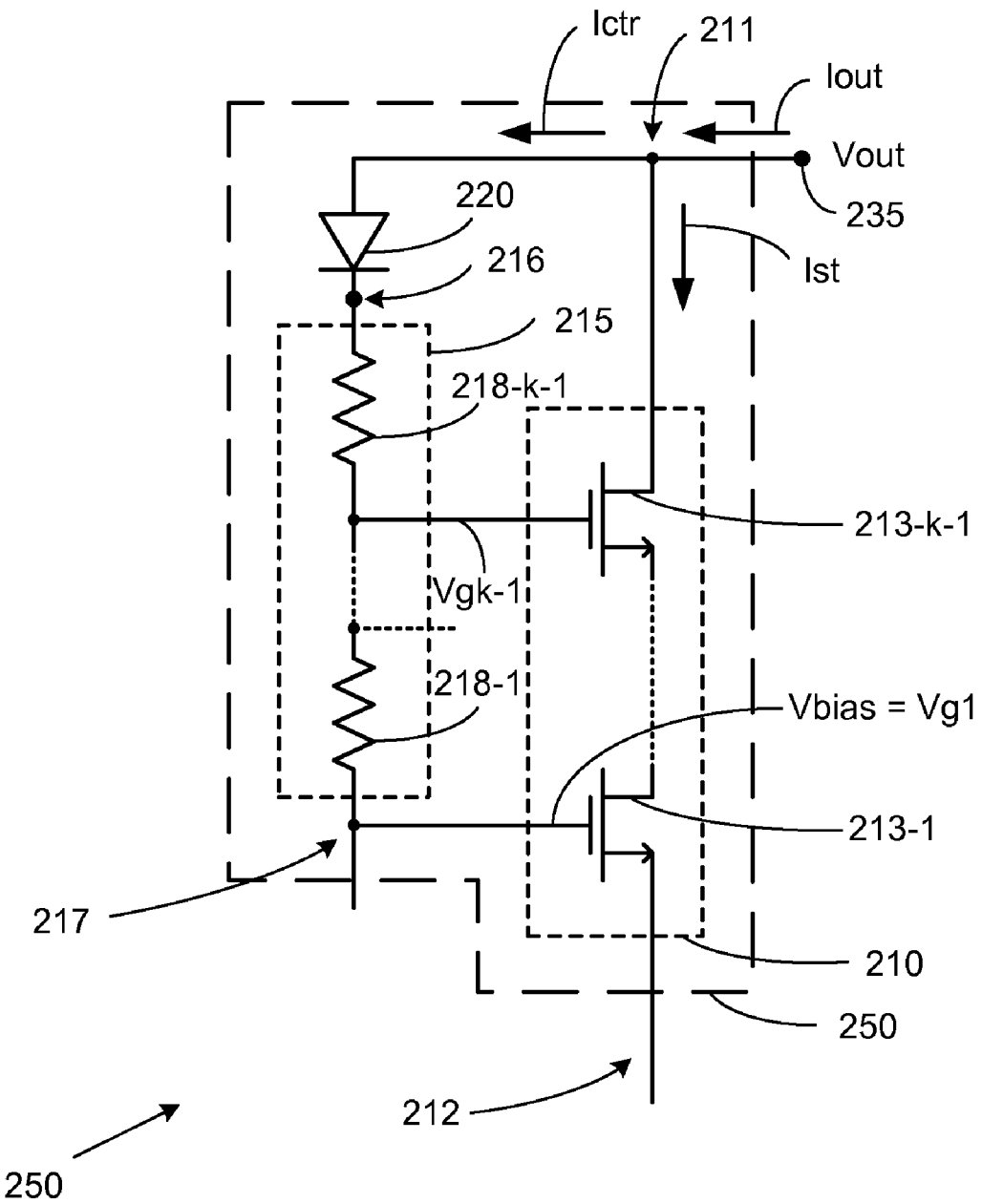
FIG. 2 shows a circuit diagram of a voltage expander according to an embodiment of the present invention.

FIG. 2 shows a circuit diagram of voltage expander 250 with wide voltage swing, according to an embodiment of the present invention. The voltage expander 250 can extend the voltage swing at the output node 235, which has a typical voltage swing of 1×Vdd at node 212 to about 0V to k−1 times Vdd at the output 235 of voltage expander 250. Similar to the circuit in FIG. 1, voltage expander 250 also utilizes a number (k−1) of stacked transistors 210, i.e., 213-1 to 213-k−1. However, the gate voltages Vg1 to Vgk−1 of the stack of transistors 210 depend on the output voltage Vout at node 235 instead of having fixed gate voltage levels or depending on the input voltage, as is known to those skilled in the art. The gate voltages Vg1 to Vgk−1 are generated by voltage divider 215 together with a series diode 220 in a diode 220 and voltage divider 215 arrangement that couples between the output 235 of the voltage expander 250 and the bias voltage Vbias at node 217. Vbias is set at about 1×Vdd. Diode 220 blocks the flow of current from voltage divider 215 back to the output terminal 235.

In this arrangement, the gate voltages Vg1 to Vgk−1 of the stacked transistors 213-1 to 213-k−1 can be written as $$Vgj = Vbias + \frac{\sum_{m=1}^{j} R_m}{\sum_{i=1}^{k-1} R_i}(Vout - Vd - Vbias) \text{ for } Vout > Vbias + Vdiode \quad (1)$$

$$Vgj = Vbias \text{ for } Vout < Vbias + Vdiode \quad (2)$$

where Vdiode is the diode voltage drop. As shown in equation 1, the gate voltages Vgj are linearly proportional to the output voltage for Vout>Vbias+Vdiode and the stacked transistors 210 are operating in the saturation region. When Vout<Vbias+Vdiode, all the gate voltages Vgj are equal to Vbias when the stacked transistors 210 are operating in the triode region. Nevertheless, stacked transistors 210 still remain in the ON state, which is an important feature that allows the output voltage Vout to swing below 1×Vdd.

If the stacked transistors 210 were, instead, in the OFF state, no current would be allowed to flow through the stack of transistors 210 for pulling down the output voltage Vout below 1×Vdd, and hence the output swing will be limited. By operating the stack of transistors 210 in different regions according to the output voltage Vout, it allows the voltage swing at node 212 to be extended from about 1×Vdd to k−1×Vdd with all the transistors operating under their voltage breakdown limits.

Note that the output current of the voltage expander 250 is equal to the current flow through the stacked transistors 210, Ist, and the current flow through the diode 220 and voltage divider 215 arrangement, Ictr, which can be expressed as $$Ictr = (Vout - Vd - Vbias) / \sum_{i=1}^{k-1} R_i \text{ for } Vout > Vbias + Vdiode \quad (3)$$

$$Ictr = 0 \text{ for } Vout < Vbias + Vdiode \quad (4)$$

Hence, Ictr is also linearly proportional to Vout. The linearity of Ictr with respect to the output voltage is an important feature for using the voltage expander 250 for various linear applications.

Figure 3:
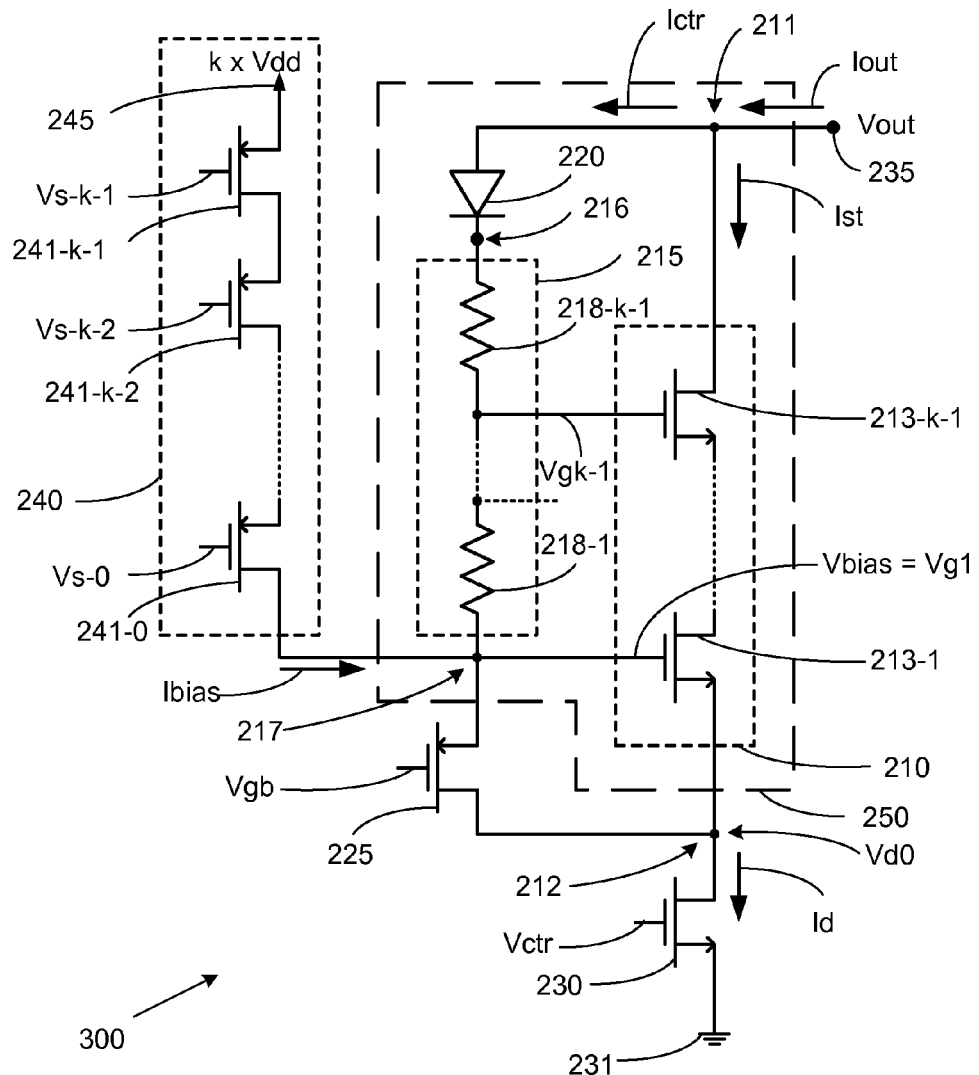
FIG. 3 shows a circuit diagram of a high voltage wide swing current source according to another embodiment of the present invention.

FIG. 3 shows a circuit diagram of a high voltage wide swing current source according to another embodiment of the present invention. Current source 300 includes voltage expander 250, transistors 230 and 225 and current source 240. Using voltage expander 250, a high voltage wide swing current source 300 is shown in FIG. 3. Two transistors 225 and 230 are added to voltage expander 250 and the current source 300 can have a voltage swing from about 0V to k×Vdd. For Vout>Vbias+Vdiode, transistor 230 defines the total current at the output 235 of the voltage expander, Iout. Transistor 225 is used for transferring the current flow through the diode 220 and voltage divider 215 arrangement (Ictr) to the drain of transistor 230, Id, such that Id is equal to Ictr+Ist and hence, is equal to Iout. The gate voltage of transistor 225, Vgb, is set to a value such that Vbias is equal to about 1×Vdd. The gate voltage Vgb of transistor 225 sets the voltage of the second terminal 217 of voltage divider 215. For Vout<Vbias+Vdiode, transistor 225 will operate in the cut-off region and Vbias may not be well defined. To prevent this from happening, a simple high voltage current source 240 with a value of Ibias is coupled to Vbias such that there is always current flow through transistor 225 even when Vout<Vbias+Vdiode and Ictr=0. In this case, the total drain current of transistor 230, Id, is equal to Ibias+Ictr+Ist. Since the output current at the voltage expander 250, Iout, is equal to Ictr+Ist, the output current of the high voltage wide swing current source 300 is always constant and equal to Id−Ibias for the entire voltage range between about 0V and k×Vdd when Ibias is added. Current source 240 includes transistor 240-0 and a stack of (k−1) transistors 241-1 to 241-k−1 with gate voltages Vs-1 to Vs-k and connected to voltage supply k×Vdd at terminal 245. The gate voltage Vs-0 controls the output current for current source 240.

In alternate embodiments, the voltage expander 250 and the high voltage current source 300 can be made of bipolar junction transistors. In all of these various operational configurations, the voltages across the different terminals of all the transistors are less than the breakdown voltage of any of the transistors.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

I claim:

1. A high voltage current source implemented in a low voltage process, comprising:
    a plurality of stacked transistors having their conduction paths coupled in series between a first and a second terminal, wherein the first terminal is an output terminal;
    a voltage divider having a first and a second terminal, wherein the voltage divider generates a plurality of control voltages based on a bias voltage (Vbias) coupled to the second terminal of the voltage divider, and each of the plurality of control voltages is coupled to a respective control terminal of the plurality of stacked transistors;
    a diode coupled in series between the first terminal of the voltage divider and the output terminal; wherein the plurality of control voltages applied to the respective control terminals of the stacked transistors are configured for the plurality of stacked transistors to withstand a voltage greater than the breakdown voltage of any transistor of the plurality of stacked transistors; and
    a first transistor coupled in series between the second terminal of the plurality of stacked transistors and a ground terminal, wherein the first transistor is configured to set the output current.

2. The high voltage current source of claim 1, further comprising:
    a second transistor coupled in series between the second terminal of the voltage divider and the second terminal of the plurality of stacked transistors, wherein the second transistor provides a circuit path for current to flow between the voltage divider and the first transistor.

3. The high voltage current source of claim 1, further comprising:
    a current source coupled in series between a voltage supply terminals and the second terminal of the plurality of stacked transistors, wherein the current source comprises an output current controlling transistor and a second plurality of stacked transistors.

4. The high voltage current source of claim 1, wherein the transistors are field effect transistors or bipolar junction transistors.

5. The high voltage current source of claim 1, wherein the voltage divider comprises a plurality of serially coupled resistors.

6. The high voltage current source of claim 1, wherein the diode blocks the flow of current from voltage divider back to the output terminal.

7. The high voltage current source of claim 1, wherein:
    an operating voltage for each transistor of the plurality of stacked transistors=Vdd,
    a supply voltage=k×Vdd, where k=the number of series coupled transistors coupled between the ground terminal and the output terminal,
    the output voltage of the high voltage current source is less than or equal to k×Vdd, and
    the breakdown voltage of any of the plurality of stacked transistors is greater than the operating voltage.

8. The high voltage current source of claim 1, wherein the plurality of control voltages are generated as a function of the output voltage at output terminal.

9. The high voltage current source of claim 2, wherein a voltage coupled to the control terminal of the second transistor sets the voltage at the second terminal of voltage divider.

* * * * *